United States Patent
Yan et al.

(10) Patent No.: US 12,400,050 B2
(45) Date of Patent: Aug. 26, 2025

(54) GRAPH CONVOLUTION AUTO-ENCODER BASED MULTI-SCALE METHOD FOR COMPUTING ROAD NETWORK SIMILARITY

(71) Applicant: LANZHOU JIAOTONG UNIVERSITY, Lanzhou (CN)

(72) Inventors: Haowen Yan, Lanzhou (CN); Xiaomin Lu, Lanzhou (CN); Weifang Yang, Lanzhou (CN); Wende Li, Lanzhou (CN); Jingzhong Li, Lanzhou (CN); Xiaoning Su, Lanzhou (CN); Pengbo Li, Lanzhou (CN); Xiaorong Gao, Lanzhou (CN); Fengshan Su, Lanzhou (CN)

(73) Assignee: LANZHOU JIAOTONG UNIVERSITY, Lanzhou (CN)

( * ) Notice: Subject to any disclaimer, the term of this patent is extended or adjusted under 35 U.S.C. 154(b) by 0 days.

(21) Appl. No.: 18/912,742

(22) Filed: Oct. 11, 2024

(65) Prior Publication Data
US 2025/0124178 A1    Apr. 17, 2025

(30) Foreign Application Priority Data
Oct. 11, 2023  (CN) .......................... 202311315929.9

(51) Int. Cl.
*G06F 30/13* (2020.01)
(52) U.S. Cl.
CPC .................. *G06F 30/13* (2020.01)

(58) Field of Classification Search
CPC ...... G06N 3/094; G06N 3/088; G06N 3/0455; G06N 3/04
See application file for complete search history.

(56) References Cited

PUBLICATIONS

Huafei Yu, Tinghua Ai, Min Yang, Weiming Huang & Lars Harrie (2023), A graph autoencoder network to measure the geometric similarity of drainage networks in scaling transformation, International Journal of Digital Earth, 16:1, 1828-1852 (Year: 2023).*

(Continued)

*Primary Examiner* — Schyler S Sanks

(57) ABSTRACT

Disclosed is a graph convolution auto-encoder based method for computing road network similarity. The method includes: creating a dual graph of a road network, and giving road network space feature information to nodes of the dual graph from three aspects of global, local and connection characteristics on the basis of a relation principle between an entire structure and parts of the structure, such that a quantitative expression of a road network graph structure is obtained; aggregating and updating node feature information and structure information of a road network graph by the graph convolution auto-encoder, and forming a deep understanding of the road network, such that a coded expression of node information of the road network is obtained; and mapping a complex high-dimensional feature space to an easy-to-measure low-dimensional feature space through an average pooling operation, so as to obtain a set of feature vectors, and computing the similarity.

2 Claims, 27 Drawing Sheets

(56) References Cited

PUBLICATIONS

Weibel, Robert. "Generalization of spatial data: Principles and selected algorithms." Advanced School on the Algorithmic Foundations of Geographic Information Systems (1996): 99-152. (Year: 1996).*
CNIPA, Notification of First Office Action for CN202311315929.9, Jul. 31, 2024.
Lanzhou Jiaotong University (Applicant), Replacement claims (allowed) of CN202311315929.9, Aug. 9, 2024.
CNIPA, Notification to grant patent right for invention in CN202311315929.9, Aug. 19, 2024.

* cited by examiner

GRAPH CONVOLUTION AUTO-ENCODER BASED MULTI-SCALE METHOD FOR COMPUTING ROAD NETWORK SIMILARITY

TECHNICAL FIELD

The present disclosure relates to the fields of geometry, graphics, cartography, computer-aided design and manufacture, cartography synthesis, etc., and in particular to a space similarity measurement method that considers global, local and connection features of a road network and is used in multi-scale computation of road network similarity.

BACKGROUND

A space similarity relation, a subset of spatial relations, can achieve very important applications in fields of spatial data matching, multi-scale expression and evaluation of spatial data, spatial query and search, comprehensive quality evaluation of maps, etc. Determination of the space similarity relation is closely related to human cognition. Quantitative expression of the similarity relation can not only enhance geographical spatial cognition and improve spatial relation theories, but also provide theoretical and technical support for map automatic generalization. As a road network is both a crucial geographical element in a map and one of the most frequently changing geographical elements, the study of its similarity relation is an important component of the similarity relation theory. If a value of an interval [0, 1] is used to indicate similarity between two targets, the larger the value, the more similar the two targets are.

Existing methods take into account geometry, topology, distribution features and some semantic features of line groups in a process of similarity computation, and a comprehensive feature measurement method has not been formed yet. Specifically, the existing methods computes similarity on the basis of artificially defined rules, and does not consider spatial features sufficiently. Although a method of multi-factor integration has achieved satisfactory results, weight setting between factors is too subjective.

In deep learning, advanced features can be captured through back propagation. As one convolutional neural network oriented to graph structure data, a graph convolutional neural network inherits advantages of the convolutional neural network in feature extraction. According to the present disclosure, by combining the advantages of the graph convolutional neural network in feature extraction and the characteristic that an auto-encoding model can reconstruct an original input graph, a graph convolution auto-encoder network based model for computing road network similarity is created, such that a similarity computation result more in line with human cognition is obtained.

SUMMARY

The present disclosure provides a graph convolution auto-encoder based multi-scale method for computing road network similarity. With advantages of a graph convolutional neural network in feature extraction and a feature that an auto-encoder model may minimize a difference between input and output, end-to-end training is conducted in an unsupervised manner, deep encoding cognition of a road network is obtained, and finally similarity between two road networks is obtained through cosine similarity computation.

In order to achieve the objective, the present disclosure uses the following technical solution:

A computation flow is as shown in FIG. 1. The flow of an algorithm may mainly be divided into the following steps:
1) creating a road network graph structure: breaking an entire road network at intersections, and creating a dual graph of the road network by converting intersections to edges and edges to nodes;
2) extracting graph node features: designing and selecting feature description parameters of roads, and extracting description features of road sections as attribute features of graph nodes;
3) creating a graph convolution auto-encoder model: building the graph convolution auto-encoder model on the basis of a graph convolutional neural network, and training the model in an unsupervised manner, so as to minimize a difference between input and output; and
4) computing the road network similarity: creating verification set data, so as to verify the graph convolution auto-encoder model obtained through training in the above step; and in response to determining that the output of the model is a node-level embedded vector, converting the output to a graph-level embedded vector, and then computing the similarity through cosine similarity.

BRIEF DESCRIPTION OF THE DRAWINGS

To describe a technical solution in embodiments of the present disclosure or in the prior art more clearly, the accompanying drawings required for the description of the embodiments or the prior art will be briefly introduced below. Obviously, the accompanying drawings in the following description are merely schematic diagrams of the present disclosure. Those of ordinary skill in the art would also derive other accompanying drawings from the accompanying drawings without making inventive efforts.

DETAILED DESCRIPTION OF THE EMBODIMENTS

The technical solution in embodiments of the present disclosure will be clearly and completely described below in combination with drawings in the embodiments of the present disclosure. Obviously, the embodiments described are merely some embodiments rather than all the embodiments of the present disclosure. On the basis of the embodiments of the present disclosure, all the other embodiments obtained by those of ordinary skill in the art without any creative effort fall within the protection scope of the present disclosure.

The model training set and test set are created as follows:

Step 1: a road network vector diagram is prepared, and data is processed by converting double lines to single lines and simplifying complex intersections.

Step 2: a road network stroke is created, roads are classified, and topological errors are corrected, such that original vector road data suitable for experiments is obtained.

Step 3: a graph structure is created.

Figure 1:
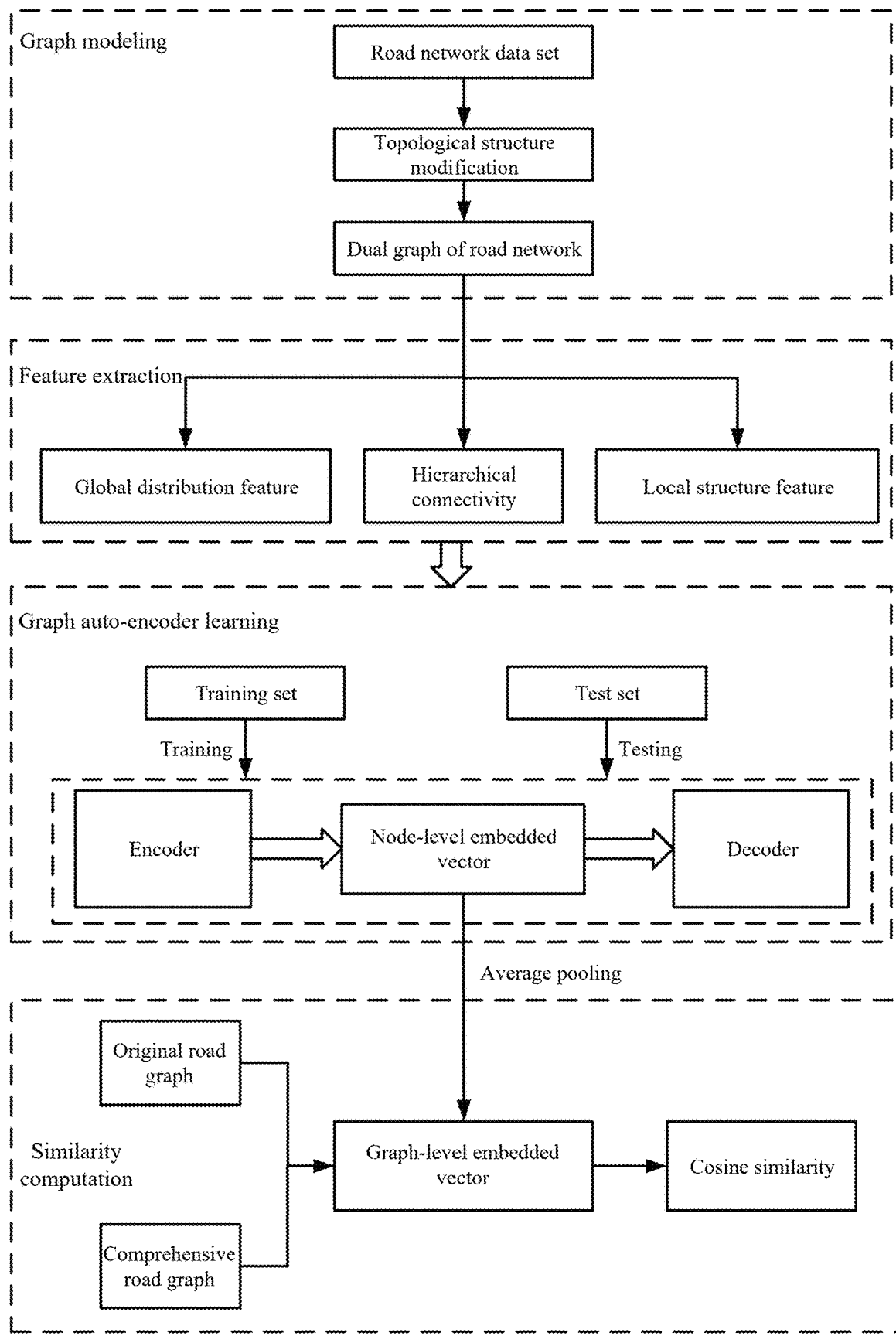
FIG. 1 is a diagram of a graph convolution auto-encoder based flow for computing road network similarity according to the present disclosure.
Figure 2:
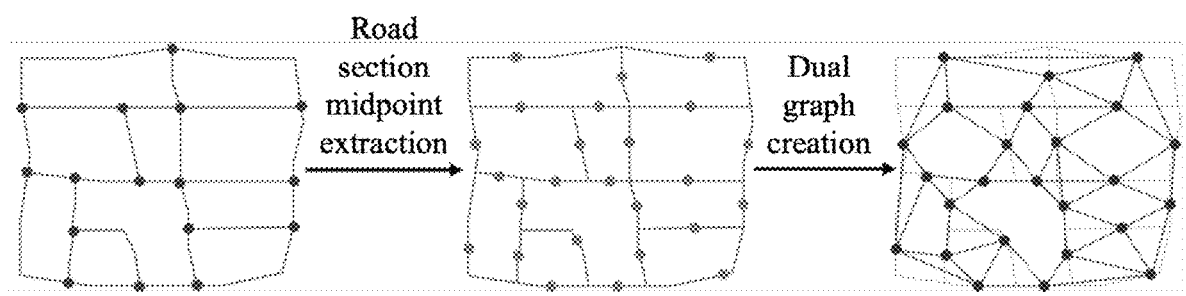
FIG. 2 is a diagram of creating a road network graph structure according to the present disclosure.

A road network is natural graph structure data. Intersections only reflect a topological connection of the road network, and main information of the road network is mostly concentrated on edges. In the graph structure, nodes may well include attribute features of road sections, and edges may describe the connection of the road network. Therefore, a dual graph of the road network can effectively solve a storage problem of the edges of the road network, so the graph structure is established by transforming the road network into the dual graph in the present disclosure, and a feature extraction problem of the road network is transformed into a dimension reduction problem of node features on the dual graph. Firstly, a road is broken at intersections, and the dual graph $G=\{V, E, W\}$ of the road network is established by converting the road sections to nodes and the intersections to the edges, where V represents a set of nodes, E represents a set of edges, and W represents an adjacent matrix of the graph. The creation mode is as shown in FIG. 2.

Step 4: feature extraction is conducted.

According to the present disclosure, the node features of the road network are learned through a graph convolution auto-encoder network, so the node features of the dual graph of the road network are an important basis for similarity computation of the present disclosure. In order to enable selected features to well reflect characteristics of the road network, the present disclosure describes the graph node features of the road network from three aspects: connection features, global features, and local features.

According to the connection features, a degree of nodes comes from a concept of a complex network, and the degree of nodes in the network indicates a number of connections between the node and other nodes. A morphological structure of the road network is complex. The degree of nodes may not only describe connectivity of the road network, but also reflect relatively important road sections in the road network. The greater the degree of nodes, the higher the importance of the road sections corresponding to the nodes. Therefore, the present disclosure uses the degree of nodes to reflect topological similarity of the road network.

Figure 3:
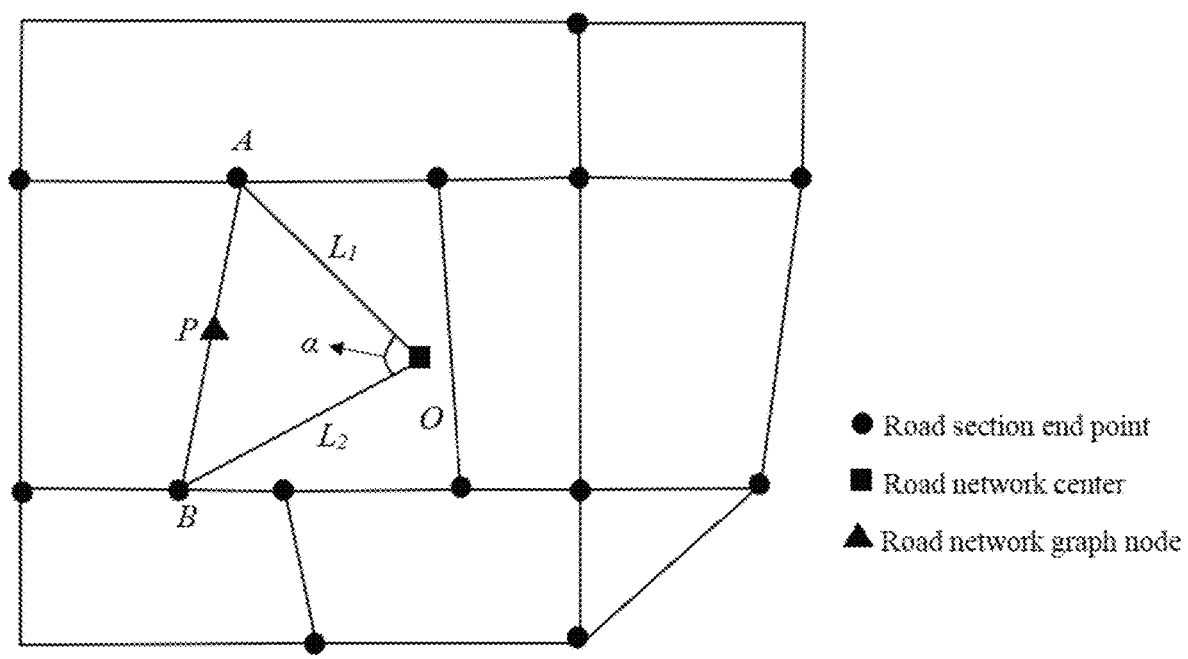
FIG. 3 is a schematic diagram of feature extraction of a global road network structure according to the present disclosure.

According to global distribution features, on the basis of the gestalt psychological cognitive principle, when people observe an object, they may firstly start from the global distribution features, that is, specific positions of components that constitute the object in human eyes, and then observe some local subtle structures. In order to quantitatively describe a position of each road section in the road network, the present disclosure uses a center of the road network as a reference point, and separately computes a difference in included angles and distances formed by connecting lines between the center and two end points of the road section, so as to express an entire structure of the road network. The two features, angle and distance differences, describe a global structure of the road network from two aspects: direction and distance, and both the two features are used to ensure uniqueness of the position of each road section in the road network. As shown in FIG. 3, a center of the road network is marked as O, two end points corresponding to node P are A and B, respectively, OA and OB are connected, a length of OA is marked as $L_1$, a length of OB is marked as $L_2$, and α is the included angle. A global feature computation formula of the node P is obtained as follows:

$$\Delta l = L_1 - L_2 \qquad (1)$$

$$\alpha = \arccos\left(\frac{L_{OA}^2 + L_{OB}^2 - L^2}{2 * L_{OA} L_{OB}}\right) \qquad (2)$$

According to local structural features, local features of the road network may reflect characteristics of each road section in the road network. In order to better describe the local structural features of the road network, the present disclosure encodes each road section of the road network by selecting the following local feature description parameters, that is, a length, a straightness, a direction average, and a long-side direction of a bounding rectangle.

1) According to the length, the length may intuitively reflect shape features of the road section, and is the most basic feature of line elements. A computation formula is as shown in Formula 3:

$$L = \sum_{i=1}^{n} \sqrt{(x_{i+1} - x_i)^2 + (y_{i+1} - y_i)^2} \qquad (3)$$

Figure 4:
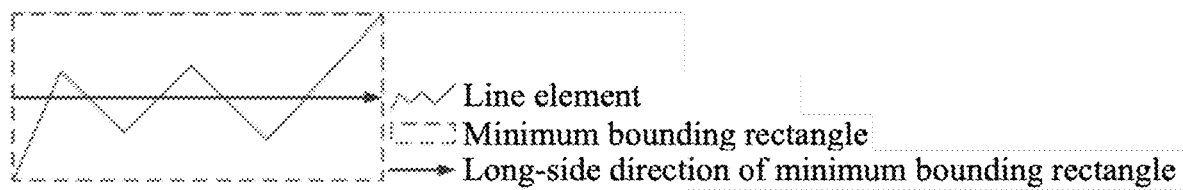
FIG. 4 is a schematic diagram of computing a long-side direction of a minimum bounding rectangle according to the present disclosure.

2) Tortuosity is a ratio of a total length of the road section to a length of a connecting line between head and tail points of the road section.
3) According to the long-side direction of the bounding rectangle, a direction of a single line element is generally divided into a global direction and a local direction. In the present disclosure, a long-side direction of a minimum bounding rectangle of the line element is used to represent the global direction, and an azimuth angle is used for quantitative description. As shown in FIG. 4:
4) Direction average According to the method, a ratio of a length of each broken line segment in the road section to the total length of the road section is used as a weight coefficient, direction angles formed by all broken line segments in the road section are multiplied by the corresponding weight coefficients, and finally the weighted direction angles are accumulated and summed to obtain a value of the direction average. The direction average uses the length as a weight factor, and comprehensively considers direction and angle, such that local detail differences of the road sections can be better reflected.

Figure 5:
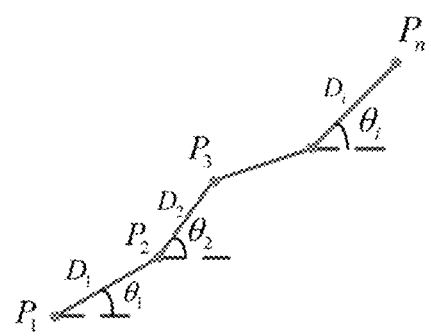
FIG. 5 is a schematic diagram of a direction average according to the present disclosure.

As shown in FIG. 5, if a length of an entire road section is denoted as L and a distance between two adjacent points in the road section is denoted as $D_i$, a computation method for a length coefficient is as shown in Formula 4:

$$\lambda = \frac{D_i}{L} \qquad (4)$$

For the entire road section, a direction average may be computed through Formula 5:

$$\theta_{Mean\,value} = \lambda_1 \theta_1 + \lambda_2 \theta_2 + \ldots + \lambda_i \theta_i \qquad (5)$$

In the formula, $\theta_1$ denotes an included angle between an i-th connecting line and a positive direction of an x-axis.
Step 5: a model training set and a test set are created.
A data set required for the experiment is mainly obtained from the OSM official website (www.openstreetmap.org). Road network data of different zones are manually captured from downloaded road network data as an initial data set of the experiment. Due to nonstandard road network data of OSM, the initial data set needs to be preprocessed, and the preprocessing operation mainly includes processing of some pseudo-nodes and isolated roads. In the experiment, road network data in a total of 840 different zones is captured. After data preprocessing and other operations, 800 data sets are obtained, where 700 data sets are configured for model training and the other 100 data sets are configured for model testing.

A graph convolution auto-encoder model is created and trained through the following steps:
Step 6: a graph auto-encoder is created.
The auto-encoder is mainly composed of an encoder and a decoder, and is generally configured to learn representation and effective encoding of original data. The auto-encoder is generally trained in an unsupervised manner, and has a learning objective of making a difference between an original sample and a reconstructed sample as small as possible and requiring no label reconstruction. Therefore, the present disclosure conducts feature extraction on the road network with a graph auto-encoder model, such that features extracted may well retain information of original road network data and provide support for similarity computation of the road network.

Due to high graph convolution computation efficiency and great advantages in feature extraction, the present disclosure applies the graph convolution auto-encoder model proposed in the literature to similarity computation of the road network, and conducts training and learning on this basis, such that deep feature codes of the road network are formed. The encoder of the graph auto-encoder is composed of a plurality of convolutional layers. The encoder maps an input graph into a vector space, such that a vectorized expression of spatial cognition of the road network is formed, and the decoder reconstructs an original input graph. In output variables of the encoder, each line represents a vertex. In deep learning, an inner product of vectors may be generally configured to compute cosine similarity of two vectors. Therefore, similarity of each line in a hidden variable may be learned by computing the inner product, such that an output adjacent matrix is generated.

Step 7: a loss function is selected.
According to the present disclosure, the model is trained in an unsupervised manner, and loss is computed through an unlabeled cross entropy loss function. In machine learning, cross entropy is widely configured to evaluate a difference between true probability distribution and predicted probability distribution. By minimizing cross entropy loss, the model may be as close to an actual condition as possible, and its performance and accuracy can be improved.

An ultimate objective of training in the present disclosure is to minimize a difference between input and output instead of reconstructing labels, so the unlabeled cross entropy loss function is used as a constraint to optimize the model. The smaller a cross entropy value, the higher similarity between two probability distributions, and the better a model prediction effect. A computation formula of the cross entropy loss is as shown in Formula 6:

$$\text{Loss} = -\frac{1}{N} \sum_{i=1}^{N} \left( \log\left(\sigma(Z \cdot Z^T)\right) + \log\left(1 - \sigma(Z_- \cdot Z_-^T)\right) \right) \qquad (6)$$

In the formula, σ denotes an activation function of sigmoid, Z denotes a node-level embedded vector output by the encoder, and Z_ denotes a node-level embedded vector of a negative sample. Both positive and negative samples simultaneously act on a loss function. The positive sample is an index of an edge of an adjacent matrix in the original sample. An index of an edge of the negative sample is randomly generated. A number of edges of the negative sample is consistent with that of the positive sample.

Step 8: model training and parameter setting are conducted.

Figure 7A:
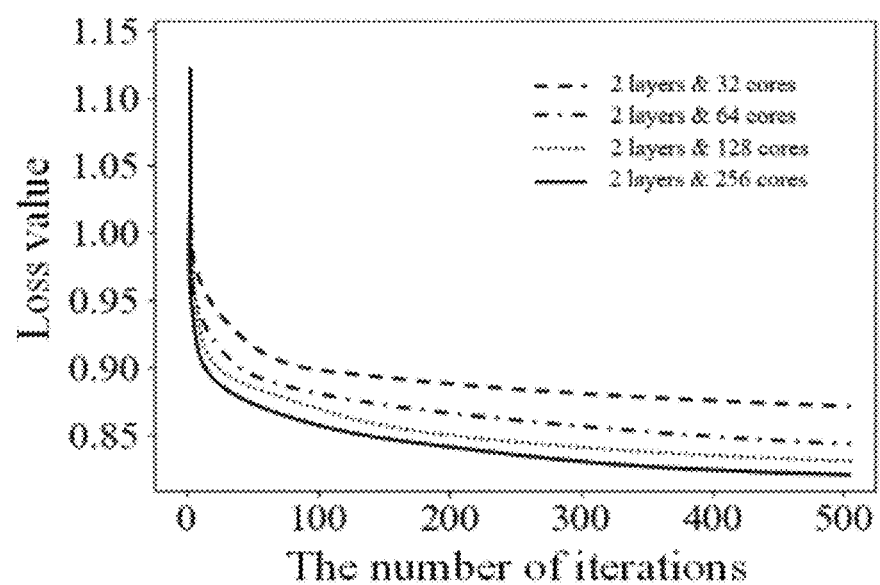
FIG. 7A shows a model training loss curve according to the present disclosure, where a number of convolutional layers is 2-different encoding dimensions.
Figure 7B:
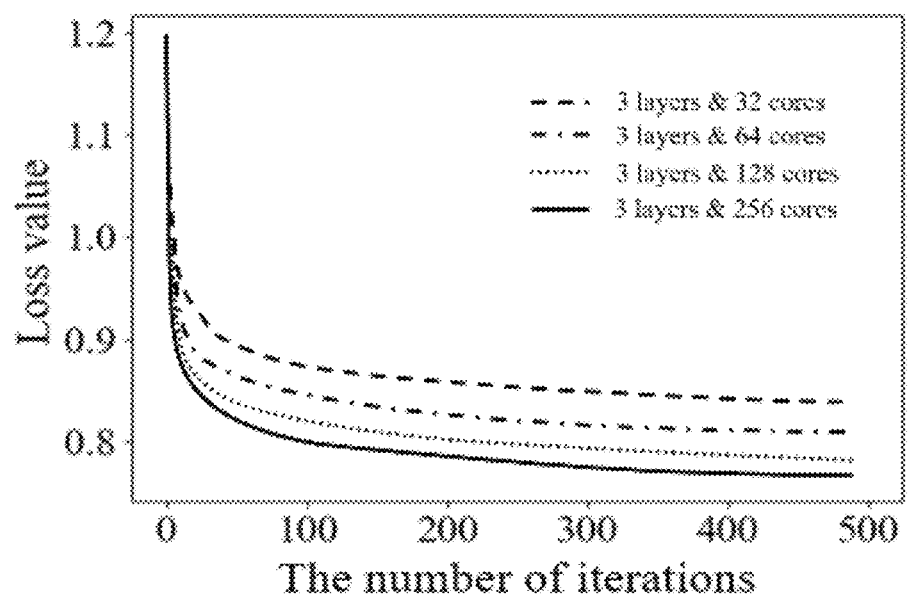
FIG. 7B shows a model training loss curve according to the present disclosure, where a number of convolutional layers is 3-different encoding dimensions.
Figure 7C:
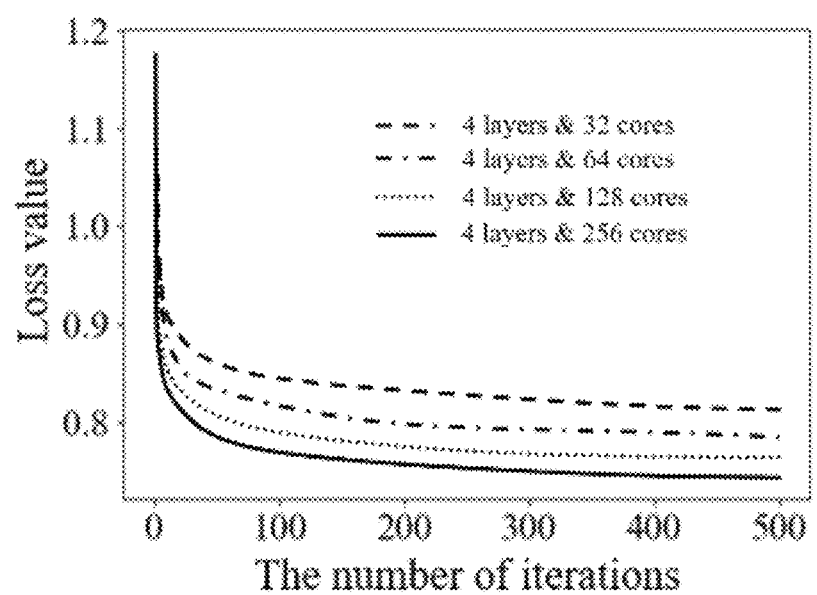
FIG. 7C shows a model training loss curve according to the present disclosure, where a number of convolutional layers is 4-different encoding dimensions.
Figure 7D:
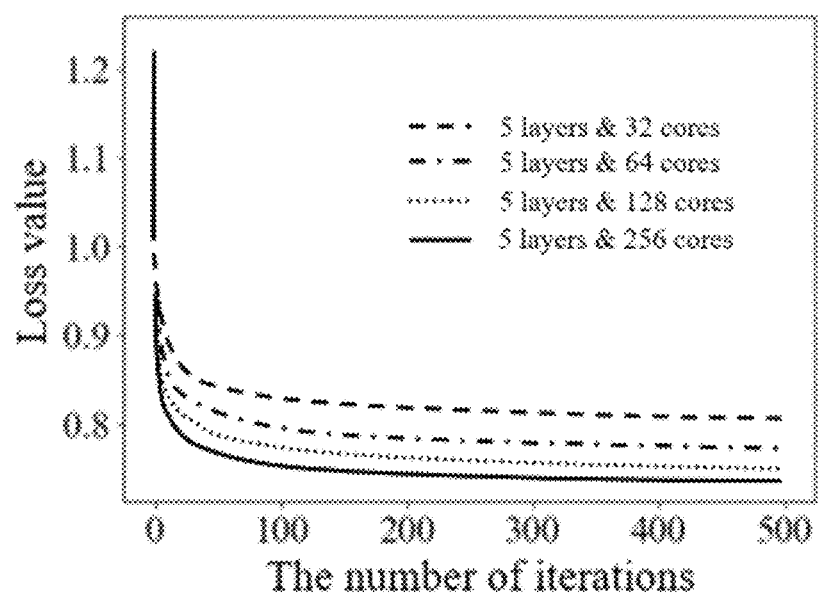
FIG. 7D shows a model training loss curve according to the present disclosure, where a number of convolutional layers is 5-different encoding dimensions.
Figure 7E:
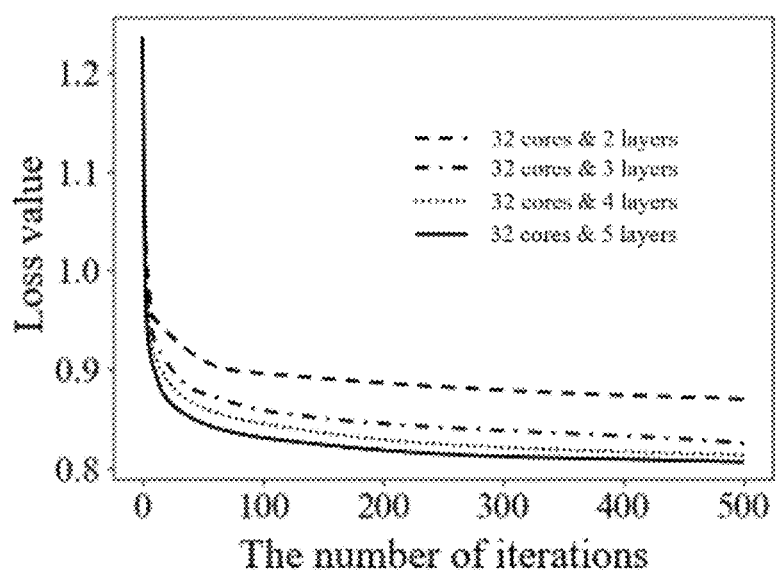
FIG. 7E shows a model training loss curve according to the present disclosure, where a number of convolutional layers is 32-different encoding dimensions.
Figure 7F:
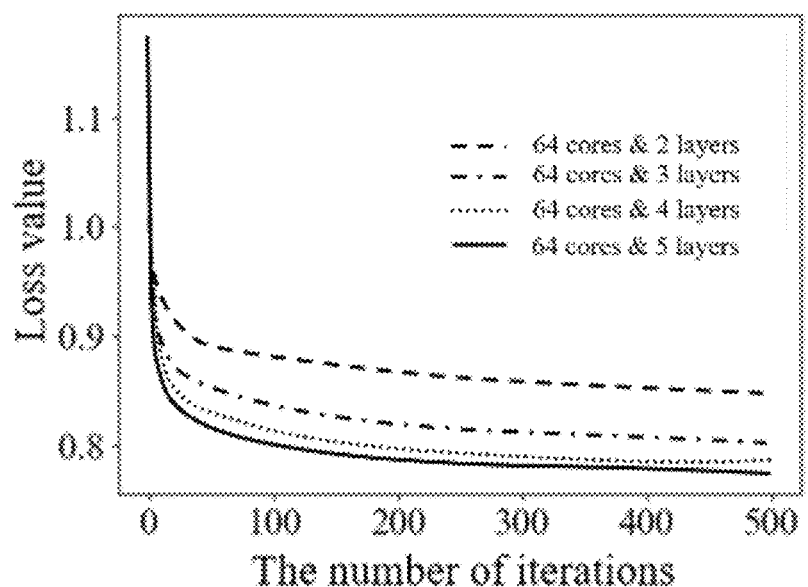
FIG. 7F shows a model training loss curve according to the present disclosure, where a number of convolutional layers is 64-different encoding dimensions.
Figure 7G:
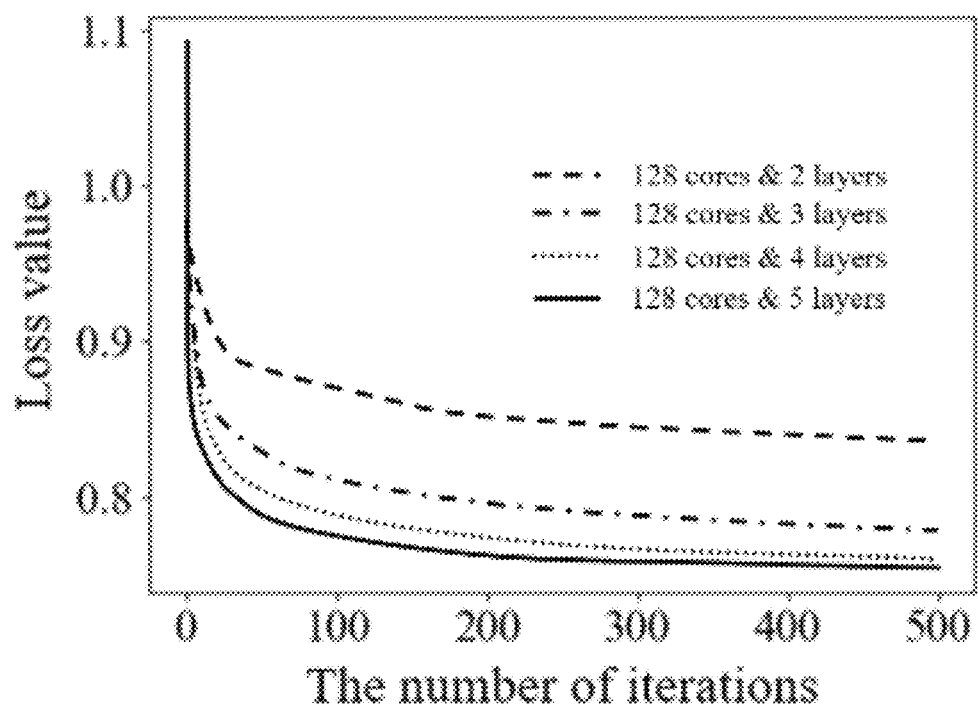
FIG. 7G shows a model training loss curve according to the present disclosure, where a number of convolutional layers is 128-different encoding dimensions.
Figure 7H:
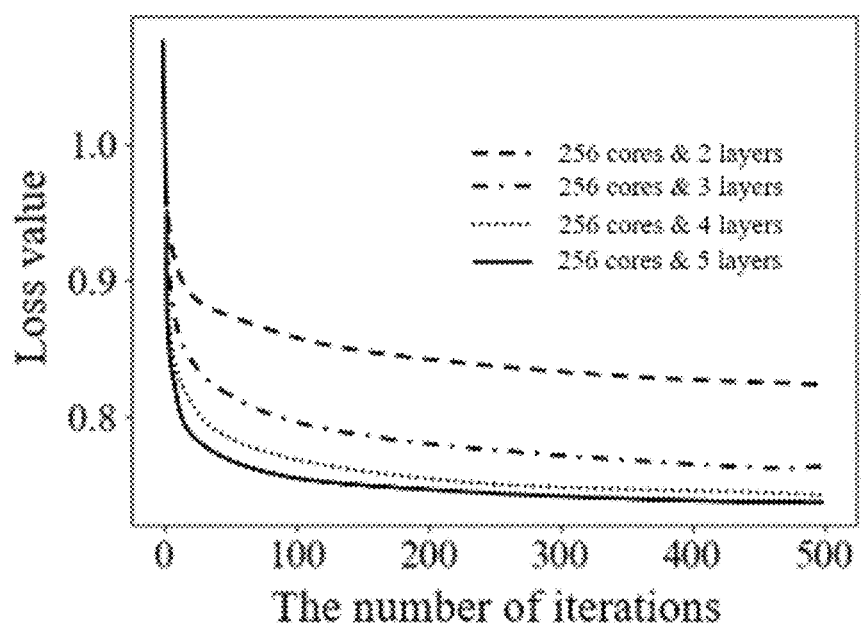
FIG. 7H shows a model training loss curve according to the present disclosure, where a number of convolutional layers is 256-different encoding dimensions.

During model training, parameters such as a number of convolutional layers and a size of a convolutional kernel may influence final performance of the model, and are further analyzed by the present disclosure. Training results are shown in FIGS. 7A-7H:

By comparing loss curves of FIG. 7A, FIG. 7B, FIG. 7C and FIG. 7D, it may be seen that in a case that a number of convolutional layers is constant, only in FIG. 7C, loss at 128 cores is lower than that at 256 cores; and in other cases, the greater an embedding dimension, the smaller the loss. In FIG. 7E, FIG. 7F, FIG. 7G and FIG. 7H, in a case that embedding dimensions are the same, the more convolutional layers, the lower the loss. The loss for 4 or 5 convolutional layers is almost the same. The greater the embedding dimension and the more convolutional layers, the lower the loss obtained by the model, because the smaller embedding dimension, the greater feature fluctuation, and the more difficult feature reconstruction of the model; and the greater dimension, the smoother the features, and the easier reconstruction. Meanwhile, with the increase of the number of the convolutional layers, captured neighborhood feature information becomes richer, and reconstruction of original features becomes more accurate. Smaller loss indicates that a graph reconstructed by the model is closer to an original input graph, and cannot explain superiority of an encoding ability. The embedding dimension of the model should not be excessive. The excessive embedding dimension may reduce an information compression ability of the model, such that the model may complete reconstruction through simple copying and mapping. Meanwhile, excessive convolutional layers may bring great computational burden, and are likely to cause gradient disappearance and explosion, thus influencing performance of the model.

A first layer of the encoder is an input layer, an input feature vector dimension is 7, an embedded feature vector dimension is 128, and an activation function is ReLU. Second to fourth layers are hidden layers. In each layer, an input feature vector dimension is 128, an embedded feature vector dimension is 128, and an activation function is ReLU.

The decoder reconstructs the original input graph by computing an inner product, and normalizes an inner product value through a sigmoid function, such that its distribution range is between (0,1).

Figure 8:
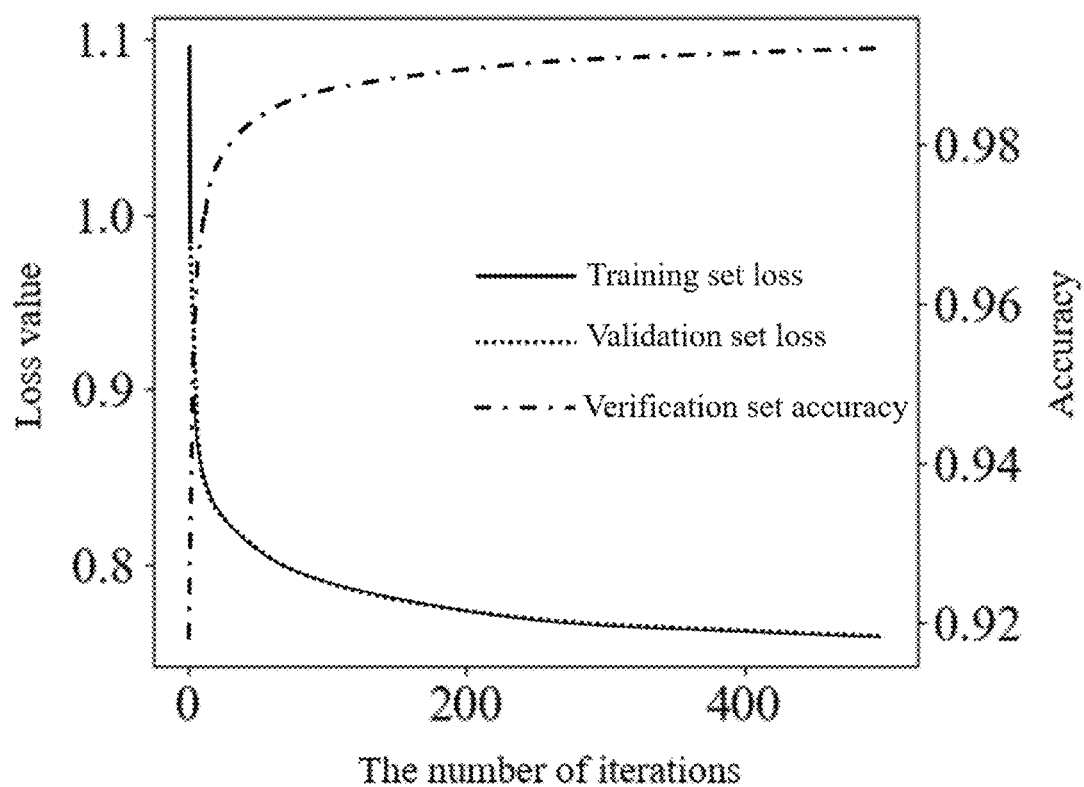
FIG. 8 is a graph showing variation of accuracy and loss values of a training set and a verification set along with iterations according to the present disclosure.
Figure 9A:
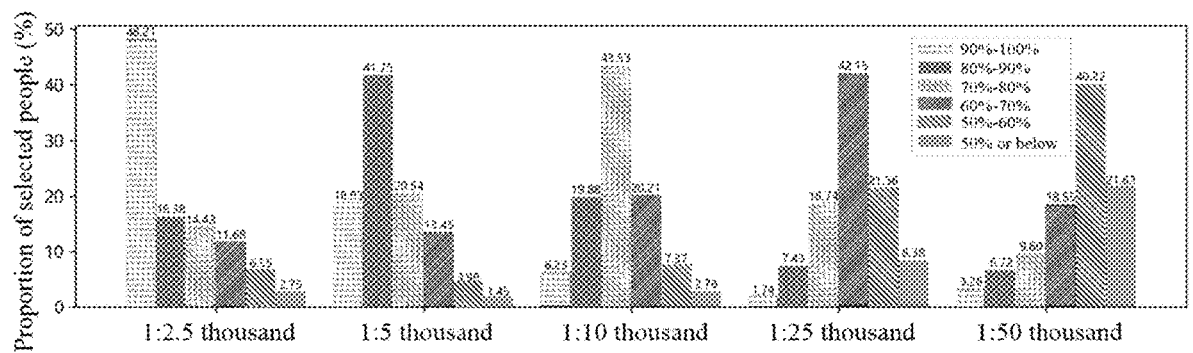
FIG. 9A shows a result graph of psychological cognition survey of a first set of experimental data according to the present disclosure, and cognition results of professionals on road network similarity under different scales.
Figure 9B:
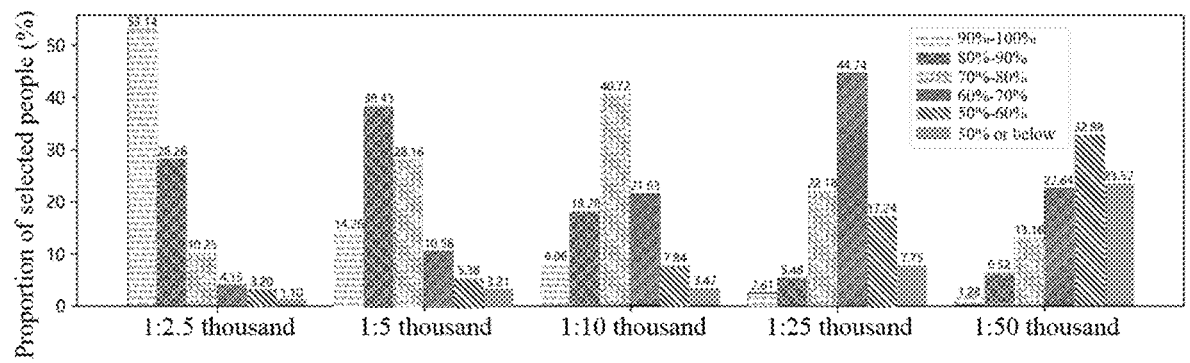
FIG. 9B shows a result graph of psychological cognition survey of a first set of experimental data according to the present disclosure, and cognition results of laypeople on road network similarity under different scales.
Figure 10A:
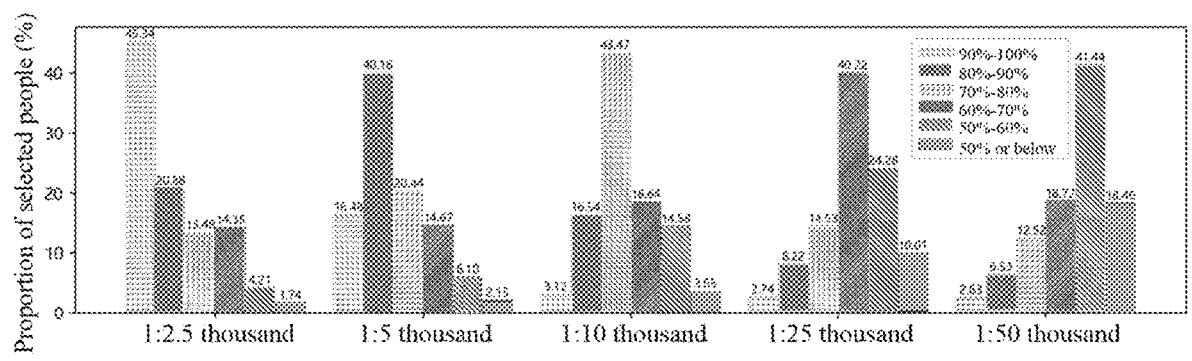
FIG. 10A shows a result graph of psychological cognition survey of a second set of experimental data according to the present disclosure, and cognition results of professionals on road network similarity under different scales.
Figure 10B:
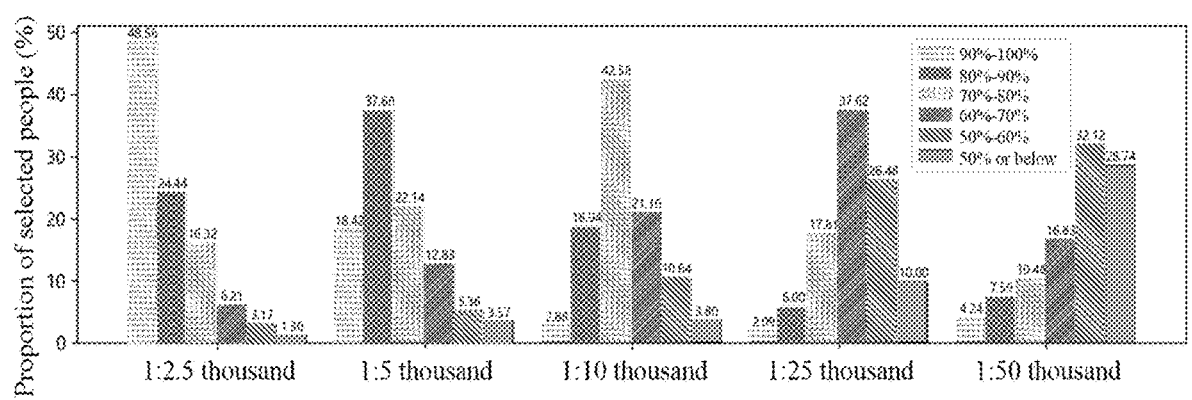
FIG. 10B shows a result graph of psychological cognition survey of a second set of experimental data according to the present disclosure, and cognition results of laypeople on road network similarity under different scales.
Figure 11A:
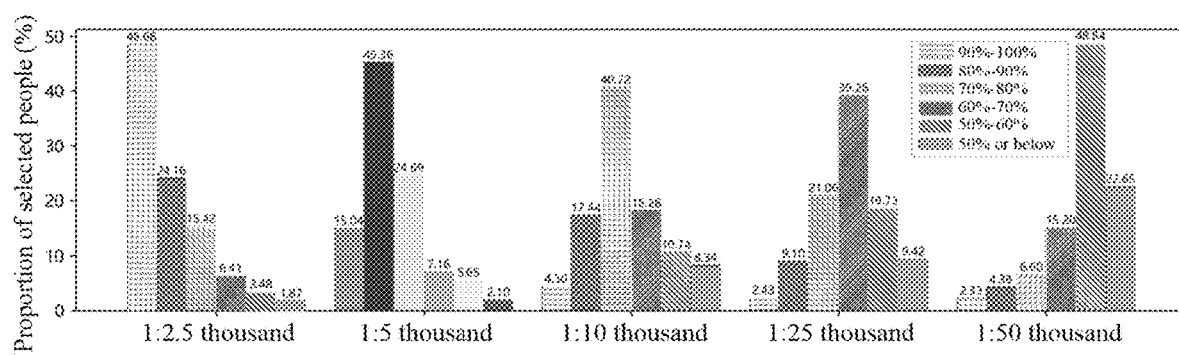
FIG. 11A shows a result graph of psychological cognition survey of a third set of experimental data according to the present disclosure, and cognition results of professionals on road network similarity under different scales.
Figure 11B:
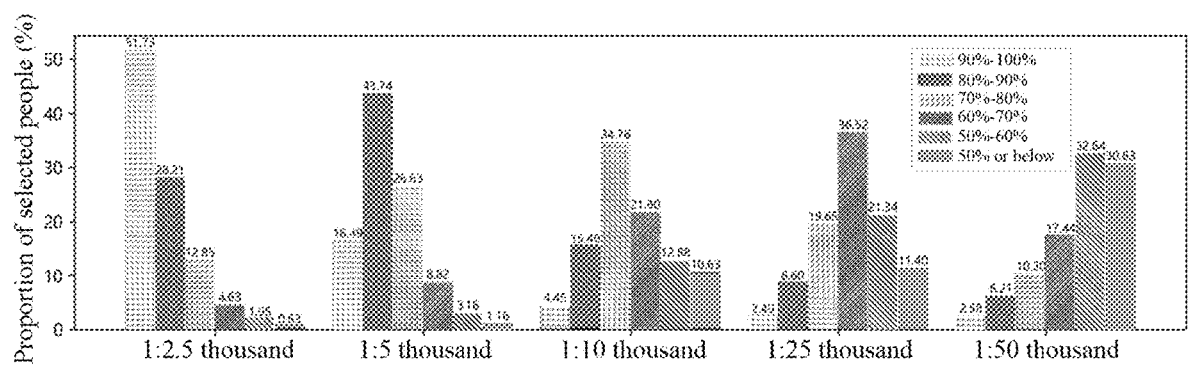
FIG. 11B shows a result graph of psychological cognition survey of a third set of experimental data according to the present disclosure, and cognition results of laypeople on road network similarity under different scales.
Figure 12A:
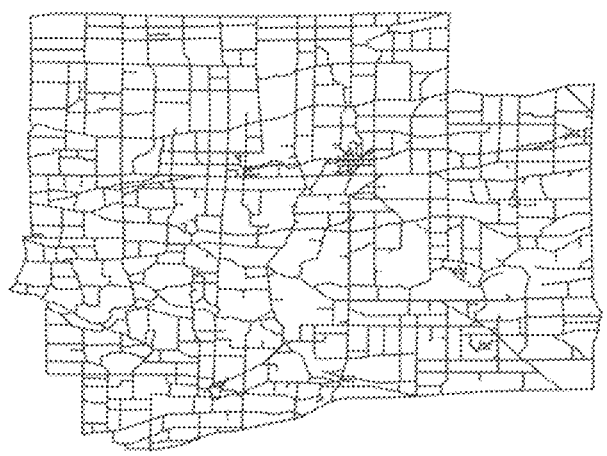
FIG. 12A shows regular similarity changing with scale change as: 1.00 (1:10,000).
Figure 12B:
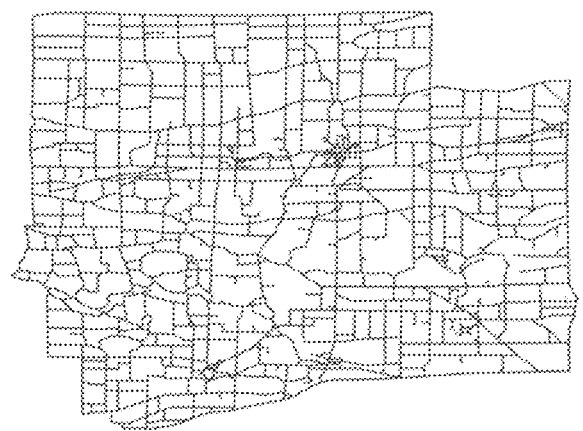
FIG. 12B shows regular similarity changing with scale change as: 0.7404 (1:100,000).
Figure 12C:
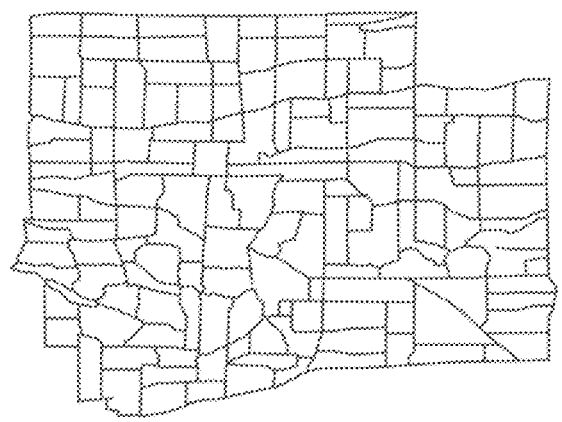
FIG. 12C shows regular similarity changing with scale change as: 0.6714 (1:250,000).
Figure 12D:
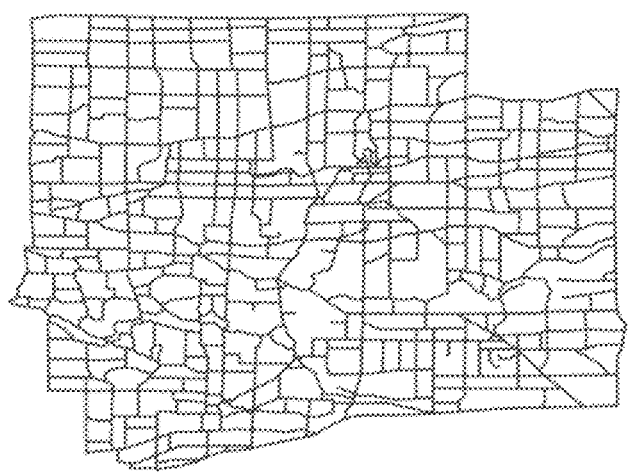
FIG. 12D shows regular similarity changing with scale change as: 0.9139 (1:25,000).
Figure 12E:
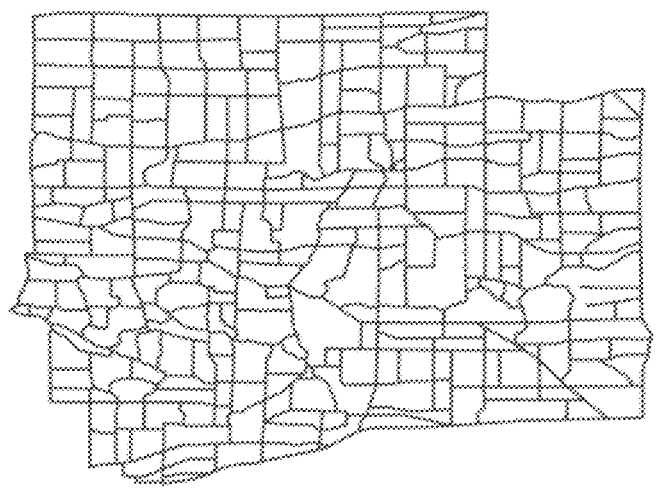
FIG. 12E shows regular similarity changing with scale change as: 0.8382 (1:50,000).
Figure 12F:
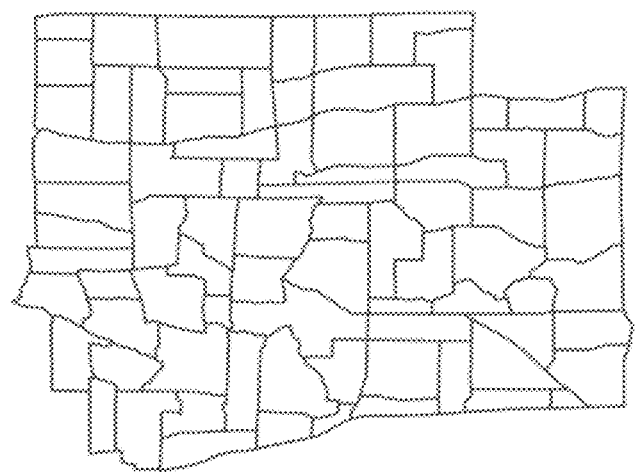
FIG. 12F shows regular similarity changing with scale change as: 0.5725 (1:500,000).

Finally, 700 training sets and 100 verification sets are used to train and verify the model, and accuracy of a reconstructed edge of the model is reflected through accuracy. Final training loss, verification loss and verification accuracy of the model are obtained as shown in FIG. 8:

As may be seen from FIG. 8, after 500 iterations, the model is basically converged, its loss value is stabilized at about 0.75, and its accuracy on the verification set reaches 0.99 or above. It is further indicated that the model has high reconstruction accuracy of the original input graph and high generalization performance, and also provides support for later similarity computation of the road network.

The similarity of the road network is computed on the basis of the graph convolution auto-encoder model through the following steps:

Step 9: the verification set is obtained.

Verification data of the experiment is obtained from USGS (https://apps.nationalmap.gov), and an original road network scale is 1:10,000. Some regional road networks are randomly selected from the data and are subjected to data preprocessing and other operations, such that original road network data of the experiment is obtained. In order to ensure diversity and rationality of samples in the experiment, the original road network data is synthesized by many professionals with rich cartographic experience and engaged in similarity theory research. Firstly, road network strokes are created and then ranked according to their importance. Finally, the ranked road network strokes are scaled according to the square root rule, and road networks under five scales of 1:25,000, 1:50,000, 1:100,000, 1:250,000 and 1:500,000 are obtained. 3 original road networks are provided, each of the original road networks is synthesized 5 times, and a total of 15 road networks are obtained as the verification data of the experiment.

Step 10: node-level embedded vectors are transformed into graph-level embedded vectors.

Figure 6:
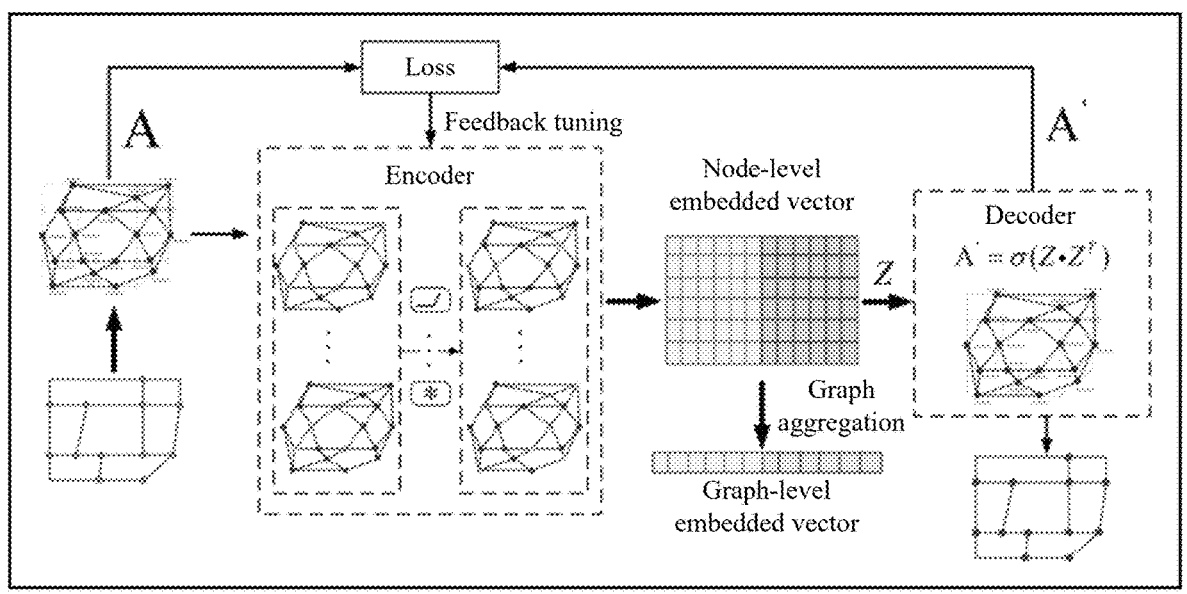
FIG. 6 shows a graph convolution auto-encoder based model for computing road network similarity according to the present disclosure.

The ultimate objective is to obtain the graph-level embedded vectors of the road network, and measurement through cosine similarity is facilitated. Therefore, the present disclosure needs to conduct an average pooling operation on output vectors of the encoder and transform the output vectors into one-dimensional vectors consistent in length and size. FIG. 6 shows a graph auto-encoder model configured to compute the similarity of the road network according to the present disclosure. A denotes an adjacent matrix of an original input graph, A' denotes an adjacent matrix after decoder reconstruction, and Z denotes the node-level embedded vectors output by the encoder. A training objective is to minimize a difference between A' and A. In the node-level embedded vectors output by the encoder, a horizontal dimension is a number of features included in each node, and a longitudinal dimension is a number of nodes. By averaging the node-level embedded vectors in columns, the graph-level embedded vectors of the road network may be obtained. Through graph aggregation of the present disclosure, not only overall features of the road network may be obtained, but also a problem of difficulty in similarity computation with inconsistent numbers of nodes may be solved. Multi-scale similarity computation of the road network can be effectively implemented.

Step 11: the similarity is computed through the cosine similarity.

In the present disclosure, training needs to be completed by means of both the encoder and the decoder, and finally the similarity computation of the road network only requires the encoder. An output vector of the encoder is a node-level embedded vector, and is one high-dimensional vector. Therefore, the node-level vector has to be aggregated and transformed into a one-dimensional graph-level vector having a consistent size with the node-level vector. The similarity of the road network is the cosine similarity between the two graph-level vectors. A computation formula is as shown in Formula 7:

$$sim_{road} = \frac{r^a \cdot r^b}{r^a r^b} = \frac{\sum_{i=1}^{m} r_i^a \times r_i^b}{\sqrt{\sum_{i=1}^{m} (r_i^a)^2} \times \sqrt{\sum_{i=1}^{m} (r_i^b)^2}} \quad (7)$$

In the formula, $r^a$ denotes a graph-level vector of road network a, $r^b$ denotes a graph-level vector of road network b, and m denotes a dimension of a graph-level vector.

Step 12: one example is given below to compute multi-scale spatial similarity of the road network.

In order to verify rationality of the method of the present disclosure, a similarity measurement experiment is conducted through the above verification data. FIGS. 12A-12F show road network data of 3 different zones before and after cartographic generalization and their similarity computation results.

According to experimental results in FIGS. 12A-12F, the similarity decreases with an increasing synthesis degree, which conforms to the theory that the similarity decreases with the increasing synthesis degree. From the experimental results of the above three sets of data, it may be seen that the road network similarity results under various scales computed by the model of the present disclosure are relatively consistent with a span of the scales, fully indicating rationality of the model. Moreover, the similarity computed under a specific scale is less different, and the difference is mainly in that the verification data under each scale is synthesized manually, without exactly consistent real data and scales.

In order to further verify applicability and effectiveness of the model of the present disclosure, demonstration will be provided below from psychological cognitive experiments. Similarity is a kind of fuzzy human perception. In order to verify whether a similarity computation result of the model is in line with human cognition, the psychological cognition experiment is conducted in a form of questionnaire, and participants give scores to similarity of a synthesized road network with reference to an original sample. Considering that human cognition is influenced by various factors in different scenes, the similarity is divided into six intervals in the questionnaire, including 90%-100%, 80%-90%, 70%-80%, 60%-70%, 50%-60% and below 50%, which allow respondents to select. A total of 420 questionnaires are collected in the psychological cognitive investigation experiment, of which 60% are professionals and 40% are non-professionals. Survey results are shown in FIGS. 9A-9B, FIGS. 10A-10B and FIGS. 11A-11B as follows:

As may be seen from FIGS. 9A-9B, FIGS. 10A-10B and FIGS. 11A-11B, in the three psychological cognitive investigation experiments, cognitive results of the non-professionals and the professionals are relatively consistent with the results computed by the model of the present disclosure, and keep a high consistency with actual road changes, which are relatively in line with the human cognition.

According to the present disclosure, global and local features and topological structure features of the road network are well considered during selection of node feature factors, the proposed graph auto-encoder model may better extract features of the road network, and the model may be trained in an unsupervised manner, such that deep-level cognition of the road network may be formed, and defects that weights are difficult to verify and are exceedingly subjective may be effectively avoided. Information of neighboring nodes may be aggregated to obtain more abundant node-level embedded information, and final similarity computation results may be more in line with the human cognition.

The above description of the disclosed embodiments enables those skilled in the art to implement or use the present disclosure. Various modifications to the embodiments are readily obvious to those skilled in the art, and general principles defined by the solution can be implemented in other embodiments without departing from the spirit or scope of the present disclosure. Therefore, the present disclosure is not limited to the embodiments shown in the solution and falls within the widest scope consistent with the principles and novel features disclosed in the present disclosure.

What is claimed is:

1. A graph convolution auto-encoder based multi-scale method for computing road network similarity, comprising computation steps:

S1: processing data by converting double lines to single lines;

S2: creating a road network stroke, classifying roads, and correcting topological errors, such that original vector road data is obtained;

S3: creating a dual graph of a road network by converting edges to nodes and intersections to edges;

S4: extracting node features from global, local and connection features;

S5: creating a model training set;

S6: creating a model test set;

S7: traversing the training set and the test set through a program, and generating a feature matrix and an adjacent matrix of an input model;

S8: building a graph convolution auto-encoder model on the basis of a graph convolutional neural network;

S9: inputting a feature matrix and an adjacent matrix of the training set into the model for unsupervised training according to a computation formula of cross entropy loss as follows:

Loss=$-1/N\Sigma_{i=1}^{N}(\log(\sigma(Z \cdot Z^T))+\log(1-\sigma(Z\_ \cdot Z\_^T)))$, where $\sigma$ denotes an activation function of sigmoid, Z denotes a node-level embedded vector output by the encoder, Z_ denotes a node-level embedded vector of a negative sample, and N denotes a number of samples;

S10: observing model convergence through loss curves of the training set and the test set and accuracy of the test set;

S11: saving a trained model;

S12: conducting scale transformation on obtained road network data, and obtaining road network data under multi-scales;

S13: separately computing node-level embedded vectors of two to-be-compared road networks through the model saved in the step S11;

S14: transforming the node-level embedded vectors into graph-level embedded vectors through an average pooling operation, and obtaining two sets of one-dimensional vectors consistent in size; and S15: computing similarity between the two one-dimensional vectors through cosine similarity, and obtaining similarity $s_{im}$ between all roads subjected to scale change and an original road; wherein a computation formula of the similarity $s_{im}$ is represented as follows:

$$\text{sim}_{road} = \frac{r^a \cdot r^b}{r^a r^b} = \frac{\sum_{i=1}^{m} r_i^a \times r_i^b}{\sqrt{\sum_{i=1}^{m}(r_i^a)^2} \times \sqrt{\sum_{i=1}^{m}(r_i^b)^2}};$$

where $r^a$ denotes a graph-level vector of road network a, $r^b$ denotes a graph-level vector of road network b, and m denotes a dimension of a graph-level vector;

wherein according to the steps S7 to S11, the model is trained through a data set created according to the steps S1 to S6.

2. The graph convolution auto-encoder based multi-scale method for computing road network similarity according to claim 1, wherein in the steps S12 to S15, the model trained in the steps S7 to S11 is configured to compute the road network similarity in a multi-scale manner.

* * * * *